United States Patent
Lopez et al.

(10) Patent No.: US 11,814,964 B2
(45) Date of Patent: Nov. 14, 2023

(54) VALVE POSITION CONTROL

(71) Applicant: ABB Schweiz AG, Baden (CH)

(72) Inventors: Camilo Lopez, Export, PA (US); Mark Foltz, Pittsburgh, PA (US); Steve Miller, Pittsburgh, PA (US); Kevin Dowdell, Pittsburgh, PA (US); Mark Wieland, Cranberry, PA (US); Alan Majors, Pittsburg, PA (US)

(73) Assignee: ABB Schweiz AG, Baden (CH)

( * ) Notice: Subject to any disclaimer, the term of this patent is extended or adjusted under 35 U.S.C. 154(b) by 464 days.

(21) Appl. No.: 17/092,477

(22) Filed: Nov. 9, 2020

(65) Prior Publication Data

US 2021/0054765 A1    Feb. 25, 2021
US 2022/0154602 A9    May 19, 2022

Related U.S. Application Data

(63) Continuation of application No. PCT/US2019/031447, filed on May 9, 2019.
(Continued)

(51) Int. Cl.
*F01C 20/28* (2006.01)
*G01P 21/02* (2006.01)
(Continued)

(52) U.S. Cl.
CPC .............. *F01C 20/28* (2013.01); *F01D 17/06* (2013.01); *F01D 17/145* (2013.01); *F01D 17/26* (2013.01);
(Continued)

(58) Field of Classification Search
CPC .. F02C 7/232; F02C 9/263; F02C 9/50; F02C 9/52; F02C 9/54; F01K 13/003;
(Continued)

(56) References Cited

U.S. PATENT DOCUMENTS 2,827,020 A    3/1958    Cook
3,597,653 A    8/1971    Moore et al.
(Continued)

FOREIGN PATENT DOCUMENTS

CN    1678913 A    10/2005
EP    1191190 A1    3/2002
(Continued)

OTHER PUBLICATIONS

European Patent Office, Extended European Search Report in European Patent Application No. 19800457.4, 12 pp. (dated Jun. 30, 2022).

(Continued)

*Primary Examiner* — Loren C Edwards

(74) *Attorney, Agent, or Firm* — Leydig, Voit & Mayer, Ltd.

(57) ABSTRACT

A control system is provided for a turbine valve. The turbine valve has a first coil and a second coil to control or sense movement of a mechanical valve positioner. Two valve positioners are provided with each valve positioner having two drive circuits to drive the first and second coils. Switches are provided such that only one drive circuit is connected to each coil at a time. The control system may also include a hydraulic pilot valve section and a main hydraulic valve section. Feedbacks are used to determine a pilot valve error and a main valve error which are combined to determine a turbine valve error. The turbine valve error is repeatedly determined to minimize the error.

19 Claims, 5 Drawing Sheets

Related U.S. Application Data

(60) Provisional application No. 62/669,070, filed on May 9, 2018, provisional application No. 62/669,042, filed on May 9, 2018, provisional application No. 62/669,063, filed on May 9, 2018, provisional application No. 62/669,048, filed on May 9, 2018, provisional application No. 62/669,057, filed on May 9, 2018.

(51) Int. Cl.

| | | |
|---|---|---|
| *G01R 31/28* | (2006.01) | |
| *F01D 17/06* | (2006.01) | |
| *F02C 9/28* | (2006.01) | |
| *F01D 21/02* | (2006.01) | |
| *H02J 3/38* | (2006.01) | |
| *H02J 3/40* | (2006.01) | |
| *F01K 13/00* | (2006.01) | |
| *F01K 13/02* | (2006.01) | |
| *F16K 37/00* | (2006.01) | |
| *F02C 7/232* | (2006.01) | |
| *F02C 9/26* | (2006.01) | |
| *F02C 9/52* | (2006.01) | |
| *F02C 9/54* | (2006.01) | |
| *F01D 17/14* | (2006.01) | |
| *F01D 17/26* | (2006.01) | |

(52) U.S. Cl.
CPC ............ *F01D 21/02* (2013.01); *F01K 13/003* (2013.01); *F01K 13/02* (2013.01); *F02C 7/232* (2013.01); *F02C 9/263* (2013.01); *F02C 9/28* (2013.01); *F02C 9/52* (2013.01); *F02C 9/54* (2013.01); *F16K 37/0041* (2013.01); *F16K 37/0083* (2013.01); *G01P 21/02* (2013.01); *G01R 31/2829* (2013.01); *H02J 3/381* (2013.01); *H02J 3/40* (2013.01); *F05D 2220/31* (2013.01); *F05D 2260/80* (2013.01); *F05D 2270/02* (2013.01); *F05D 2270/021* (2013.01); *F05D 2270/80* (2013.01)

(58) Field of Classification Search
CPC .. F01K 13/02; F16K 37/0041; F16K 37/0083; F01D 17/145; F01D 17/26; F01D 21/14; F01D 21/18; F01D 21/20; F01D 25/00; F01C 20/28
See application file for complete search history.

(56) References Cited

U.S. PATENT DOCUMENTS

| | | | |
|---|---|---|---|
| 4,020,685 | A | 5/1977 | Van Millingen et al. |
| 4,099,237 | A | 7/1978 | Zitelli et al. |
| 4,183,242 | A | 1/1980 | Brown |
| 4,345,191 | A | 8/1982 | Takats et al. |
| 4,356,447 | A | 10/1982 | Hönig et al. |
| 4,434,470 | A | 2/1984 | Thomas et al. |
| 4,485,452 | A | 11/1984 | Cording et al. |
| 4,494,207 | A | 1/1985 | Chang et al. |
| 4,506,339 | A | 3/1985 | Kühnlein |
| 4,554,788 | A | 11/1985 | Hwang et al. |
| 4,602,515 | A | 7/1986 | Eichenlaub |
| 4,635,209 | A | 1/1987 | Hwang et al. |
| 4,712,372 | A | 12/1987 | Dickey et al. |
| 4,715,009 | A | 12/1987 | Böhmler et al. |
| 4,746,862 | A | 5/1988 | Ueki |
| 4,774,845 | A | 10/1988 | Barbe et al. |
| 4,788,647 | A | 11/1988 | McManus et al. |
| 4,887,214 | A | 12/1989 | Takats et al. |
| 4,955,269 | A | 9/1990 | Kendig et al. |
| 4,972,332 | A | 11/1990 | Luebbering et al. |
| 4,975,845 | A | 12/1990 | Mehta |
| 5,165,271 | A | 11/1992 | Stepper et al. |
| 5,371,460 | A | 12/1994 | Coffman et al. |
| 5,508,609 | A | 4/1996 | Parkinson et al. |
| 5,537,322 | A | 7/1996 | Denz et al. |
| 5,559,705 | A | 9/1996 | McClish et al. |
| 5,789,658 | A | 8/1998 | Henn et al. |
| 5,933,005 | A | 8/1999 | Pugh |
| 6,131,547 | A | 10/2000 | Weber et al. |
| 6,292,717 | B1 | 9/2001 | Alexander et al. |
| 6,445,995 | B1 | 9/2002 | Mollmann |
| 6,727,686 | B2 | 4/2004 | Beckmann et al. |
| 6,804,600 | B1 | 10/2004 | Uluyol et al. |
| 8,100,000 | B1 | 1/2012 | Rankin |
| 8,174,268 | B2 | 5/2012 | Bose et al. |
| 8,222,760 | B2 | 7/2012 | Menke |
| 8,352,149 | B2 | 1/2013 | Meacham |
| 8,428,784 | B2 | 4/2013 | Krueger |
| 8,464,598 | B2 | 6/2013 | Cazaux et al. |
| 8,753,067 | B2 | 6/2014 | Shindo |
| 9,140,718 | B2 | 9/2015 | O'Neil et al. |
| 9,438,026 | B2 | 9/2016 | Franks et al. |
| 9,708,926 | B2 | 7/2017 | Curlier et al. |
| 10,371,072 | B2 | 8/2019 | Gouzenne Coutier |
| 10,392,962 | B2 | 8/2019 | Rowe et al. |
| 10,487,683 | B2 | 11/2019 | Gerez et al. |
| 10,989,063 | B2 | 4/2021 | Xiong et al. |
| 2003/0007861 | A1 | 1/2003 | Brooks et al. |
| 2004/0050178 | A1 | 3/2004 | Parkinson |
| 2008/0110283 | A1 | 5/2008 | Shaver et al. |
| 2010/0088003 | A1 | 4/2010 | Meacham |
| 2010/0324799 | A1 | 12/2010 | Davison |
| 2013/0098042 | A1 | 4/2013 | Frealle et al. |
| 2013/0289933 | A1 | 10/2013 | Hess et al. |
| 2014/0070794 | A1 | 3/2014 | Cosby et al. |
| 2014/0241850 | A1 | 8/2014 | Duge |
| 2014/0260249 | A1* | 9/2014 | Shapiro ............... F01K 13/003 60/645 |
| 2015/0096371 | A1 | 4/2015 | O'Neil et al. |
| 2015/0211380 | A1 | 7/2015 | Curlier et al. |
| 2016/0090918 | A1 | 3/2016 | Certain |
| 2016/0291052 | A1 | 10/2016 | Riolo et al. |
| 2017/0343575 | A1 | 11/2017 | Brown et al. |
| 2017/0356300 | A1 | 12/2017 | Domnick et al. |
| 2018/0003073 | A1 | 1/2018 | Rowe et al. |
| 2018/0031594 | A1 | 2/2018 | Joseph et al. |
| 2018/0050789 | A1 | 2/2018 | Marone et al. |
| 2018/0050816 | A1 | 2/2018 | Yakobov et al. |

FOREIGN PATENT DOCUMENTS

| | | |
|---|---|---|
| EP | 2273649 A1 | 1/2011 |
| EP | 3757355 A1 | 12/2020 |
| JP | 49-41706 A | 4/1974 |
| JP | 52-170233 U | 12/1977 |
| JP | 53-125502 A | 11/1978 |
| JP | 58-202308 A | 11/1983 |
| JP | 60-156909 A | 8/1985 |
| JP | 61-55303 A | 3/1986 |
| JP | 61-269615 A | 11/1986 |
| JP | 61-276036 A | 12/1986 |
| JP | 61-286504 A | 12/1986 |
| JP | 62-225704 A | 10/1987 |
| JP | 8-227317 A | 9/1996 |
| JP | 2000-249629 A | 9/2000 |
| JP | 2003-148108 A | 5/2003 |
| JP | 2003-336503 A | 11/2003 |
| JP | 2004-159496 A | 6/2004 |
| JP | 2007-224918 A | 9/2007 |
| JP | 2007-302090 A | 11/2007 |
| JP | 2008-157663 A | 7/2008 |
| JP | 2012-90422 A | 5/2012 |
| WO | WO 2012/064592 A2 | 5/2012 |
| WO | WO 2014/147832 A1 | 9/2014 |

OTHER PUBLICATIONS

Japan Patent Office, Office Action in Japanese Patent Application No. 2020-563457, 13 pp. (dated Jan. 5, 2022).

(56) References Cited

OTHER PUBLICATIONS

Search Report and Written Opinion, PCT Appln. No. PCT/US19/31447, 9 pgs, dated Aug. 29, 2019.

* cited by examiner

VALVE POSITION CONTROL

BACKGROUND

The present inventions relate generally to valves, and more particularly, to controlling the position of a valve.

Electrical power plants employ large steam turbines to generate electricity. In a steam turbine, a main steam valve is used to control the flow rate of steam to the turbine. Thus, accurate valve position is important for efficient and safe operation of a steam turbine. The inventions disclosed herein may also be used to control the position of other valves as well.

BRIEF DESCRIPTION OF SEVERAL VIEWS OF THE DRAWINGS

The invention may be more fully understood by reading the following description in conjunction with the drawings, in which.

DETAILED DESCRIPTION

One aspect of the preferred embodiments is the use of relays (Solid State Relays "SSRs") that make/break connections to field I/O devices. For a redundant pair, only the module acting as the primary module activates its relays, which allow the same field devices to be connected to both modules. Preferably, redundant field devices are allowed to concurrently connect to both (redundant) valve positioners. Additionally, a single termination unit may be used, thus eliminating the need for two termination units. By contrast, other valve positioners may use separate devices for the individual modules in the redundant pair.

Figure 1:
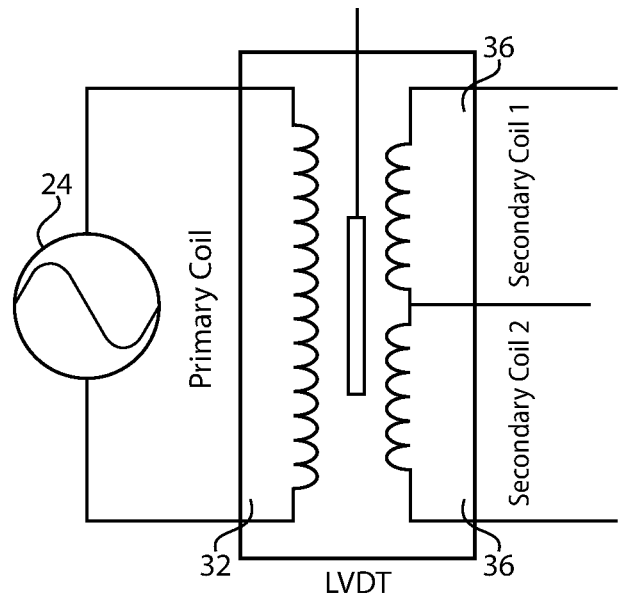
FIG. 1 is a schematic of a linear variable differential transformer (LVDT).

A LVDT (Linear Variable Differential Transformer) is shown in FIG. 1. The LVDT measures the valve position as a feedback device. The LVDT includes a rod that moves between a primary coil and two secondary coils. The primary coil may be energized with an AC voltage at a specific frequency specified by the manufacturer. As the positioning rod moves in and out of the device, the amplitude of the secondary coils vary linearly with the position of the rod. In a redundant configuration, one of the modules excites the primary coil by closing its relays to the device. The backup module opens its relays to avoid both modules trying to drive the coil. The secondary coils can connect to both modules, so each measure the same feedback. Upon failover of the primary module, the backup closes its relays as the primary opens its relay thus transferring the excitation of the primary coil to the backup module.

One feature of the preferred embodiments includes using the SSRs to isolate the drivers of the redundant modules. Another feature is the inter-module communication between the primary and the backup modules. Another feature is the ability of both modules to be connected to the same devices, so they measure the same values.

Figure 2:
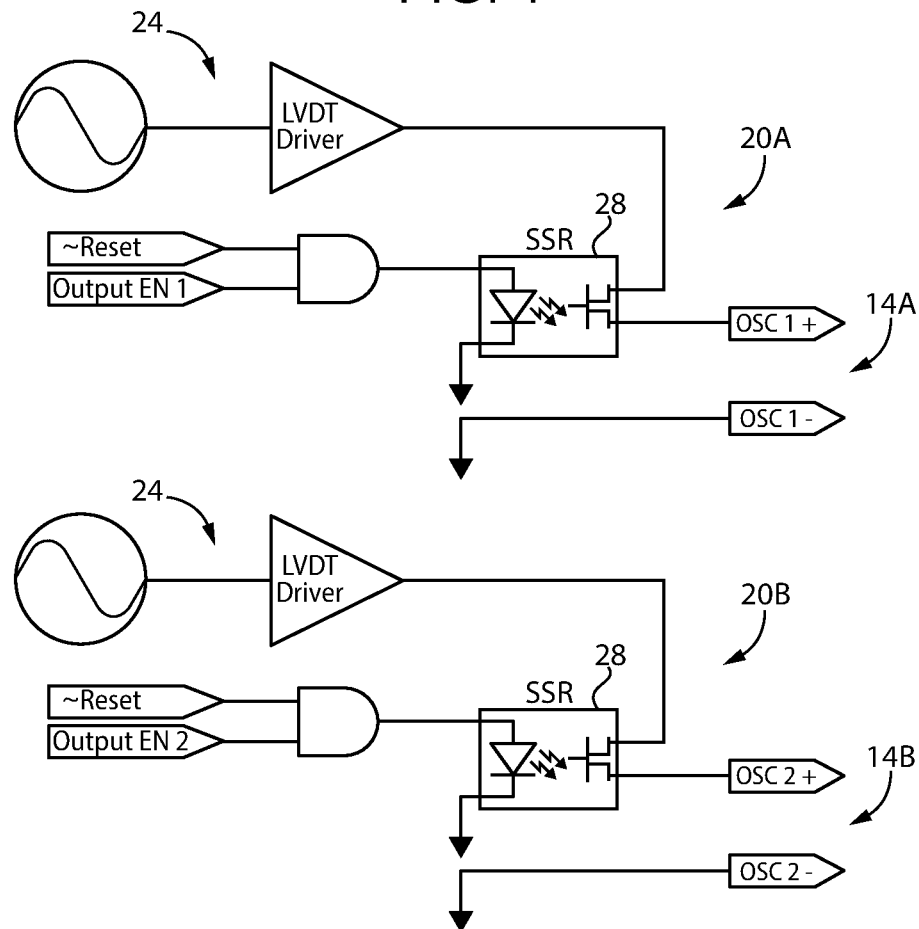
FIG. 2 is a schematic of drive circuits for redundant LVDTs.

A redundant LVDT primary oscillation diagram is shown in FIG. 2. The LVDT senses valve position. As shown, each valve positioner module preferably has two separate LVDT driver circuits to communicate with the redundant field devices (i.e., one driver circuit communicates with one of the field devices and the other driver circuit communicates with the other field device). By using the SSRs in the LVDT driver circuits, the valve positioner module may choose which field device to receive valve position measurements from.

Figure 3:
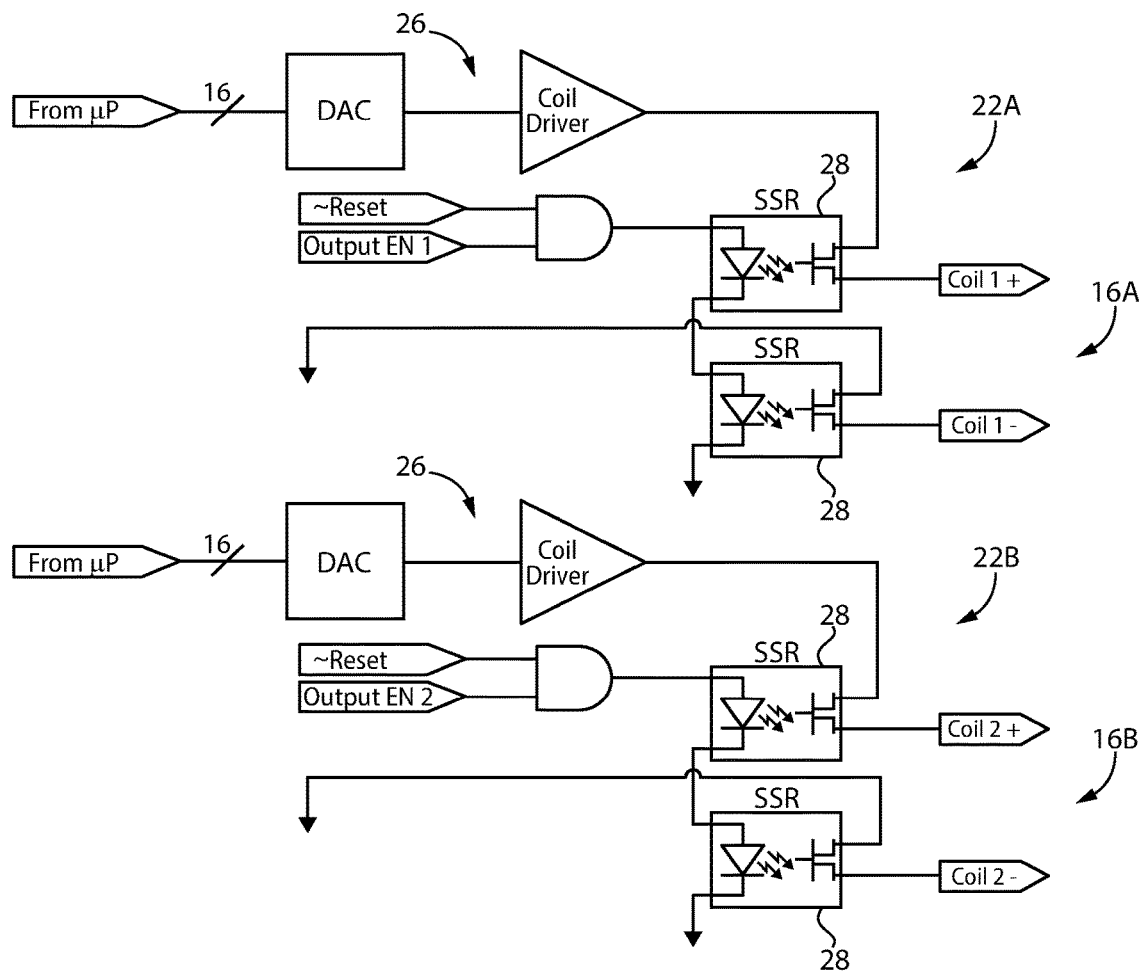
FIG. 3 is a schematic of drive circuits for redundant servo positioning coils.

A redundant servo coil driver diagram is shown in FIG. 3. The servo coil causes movement of the valve. Like FIG. 2, each valve positioner module preferably has two separate servo coil driver circuits to communicate with the redundant field devices. By using the SSRs in the servo coil circuits, the valve positioner module may choose which field device to send valve position control signals to.

One improvement associated with the preferred embodiments includes the isolation of drivers to isolate the redundant modules. Another improvement includes the ability to connect to the same I/O devices and requiring only a single termination unit. Another improvement includes the inter-module communication to accomplish fast and bumpless transfer.

A principal application for the preferred embodiments is generally large steam turbines at electrical power plants. In this application, the control system interfaces with main steam valves requiring redundant valve positioners. Furthermore, other smaller machines may also require similar redundancy, and the control system may be used in other systems requiring redundant valve controllers.

A problem overcome by the preferred embodiments is the elimination of the need to provide separate devices for the individual modules in a redundant pair. The preferred embodiments allow for the redundant field devices to concurrently connect to both (redundant) valve positioners. Moreover, a single termination unit may be connected to eliminate the need for additional hardware.

One advantage of the preferred embodiments is that redundant field devices can concurrently connect to a redundant pair of valve positioners. Another advantage is that the field device can connect to a single termination unit. Another advantage is eliminating the need for additional hardware. Another advantage is allowing for a nearly seamless transfer of coil drivers upon failover.

In the preferred embodiments, the module has redundant Solid State Relays (SSRs) that interface with the redundant field devices. Initially, the primary module activates the SSRs connecting the module to the I/O, while the backup module deactivates its SSRs to the I/O. The redundant pair of modules communicate with each other via a communication bus. Each module provides the status of its hardware and operating condition. The primary module informs the backup of the operating condition so the backup can take over control upon failover from the primary to the backup. Upon failover the primary deactivates its SSRs while the backup activates its SSRs. This transfer may occur in less than 1 millisecond allowing for a nearly seamless transfer. Since the backup (now primary) has operating conditions from the other module it can take control immediately. Furthermore, each module informs the controller of its status, so the operator becomes aware of a failed module to allow time to replace the failed module. This can be done on-line so there is no interruption of the operation of the system.

Preferably, the system includes two redundant valve positioners. Each of the valve positioners may be housed in a separate hardware module. The valve positioner modules may be plugged into one or more termination units, which provide an interface between the valve positioner modules and the field devices. The termination unit may also be thought of as a backplane of the system. Preferably, both of the redundant field devices are connected to both of the valve positioners. As described, two redundant valve positioners are also preferably provided with each valve positioner module including SSRs to control which valve positioner is connected to the field devices. The field devices sense and/or control the valves.

Another aspect of the preferred embodiments is a cascaded PI (proportional integral) control loop that may be used for a non-mechanically linked servo valve. The control loop utilizes two feedback devices to form a closed-loop control system. One of the feedback devices reports the position of the pilot valve section of the valve. The other feedback device reports the position of the main hydraulic valve section of the valve. The two sections form a cascaded process.

Unlike the typical process control employed for a non-mechanically linked valve that utilizes an inner/outer loop strategy (cascade control), the preferred embodiments resolve the errors of both parts of the process within a single control process. Moreover, the inner/outer loop strategy is typically implemented using separate processors operating on different modules, which often leads to difficulty in getting the operation to settle without oscillation due to the time lag in communication between the two processors and the different transfer rates of the two parts of the process. Preferably, the control of the preferred embodiments resides wholly within a single processor, which eliminates the problems caused by time lag that is inherent with the inner/outer loop strategy. Also, the preferred embodiments employ a weighting factor that is applied to the main valve error in order to compensate for the difference in transfer ratios between the two parts of the process.

In order to hold the main hydraulic valve section steady, the pilot valve must be held at its midpoint, referred to as the bias position. The value of the Pilot Valve Bias Position parameter sets the bias position.

The difference between the bias position and the pilot valve position yields an error value. The difference between the demand value and the main hydraulic valve position yields another error value. The two error values are used to generate a current output to move the valve. The control algorithm ramps the output current up and down in order to produce smooth movement of the valve. The control algorithm contains elements that prevent the condition commonly referred to as "integral windup" from having an impact on the control operation.

Because the two sections of this valve have different process transfer rates, one of the valve errors is multiplied by the value of the Weight Gain parameter to balance the control process. The error that has the weight gain applied to it is selected by the Weight Gain Application parameter.

The values of the Proportional Gain and Integral Factor parameters establish the rate of movement, and how quickly the control loop settles out.

The equation used in the PI algorithm has the form shown below, where E is the position error, O is the coil drive output, and $A_1$ and $A_0$ are coefficients derived from the values of P and I.

$$O_{k+1} = A_1 \cdot E_{k+1} + A_0 \cdot E_k + O_k$$

The preferred embodiments use one of the equations shown below to compute the position error, where E is the position error, D is the main hydraulic valve position demand, $R_m$ is the reported main hydraulic valve position, B is the pilot valve bias position, $R_p$ is the reported pilot valve position, and W is the value of the Weight Gain parameter. The equation that is used depends on the value of the Weight Gain Application parameter.

$$E = (D - R_m) \cdot W + (B - R_p), \text{ Weight Gain Application} = 0$$

$$E = (D - R_m) + (B - R_p) \cdot W, \text{ Weight Gain Application} = 1$$

The values of the coefficients are set by the equations shown below, where P is the proportional gain, I is the integral factor, and $T_s$ is the sample time.

$$A_1 = I \cdot \frac{T_s}{2} + P, \quad A_0 = I \cdot \frac{T_s}{2} - P$$

To utilize a P only control loop, set the value of the Integral Factor parameter to 0. The value of $A_0$ may be set to 0 in the preferred embodiments. The equation used in the control loop may be reduced to the form shown below.

$$O_{k+1} = P \cdot E_{k+1} + O_k$$

The control algorithm will not allow the value of O to become greater than the maximum coil current, as selected by the DIP switch. When a request is made for the preferred embodiments to move the valve away from a stop position, the system clears the old output value to counter the effects of integral windup, and thus there is no delay in valve movement.

Figure 4:
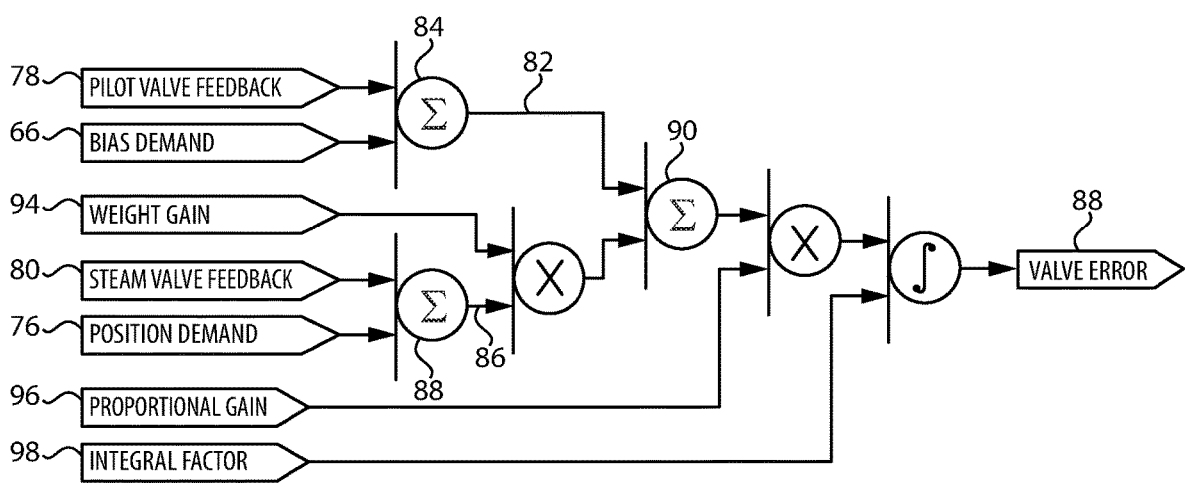
FIG. 4 is a schematic for determining turbine valve error.
Figure 5:
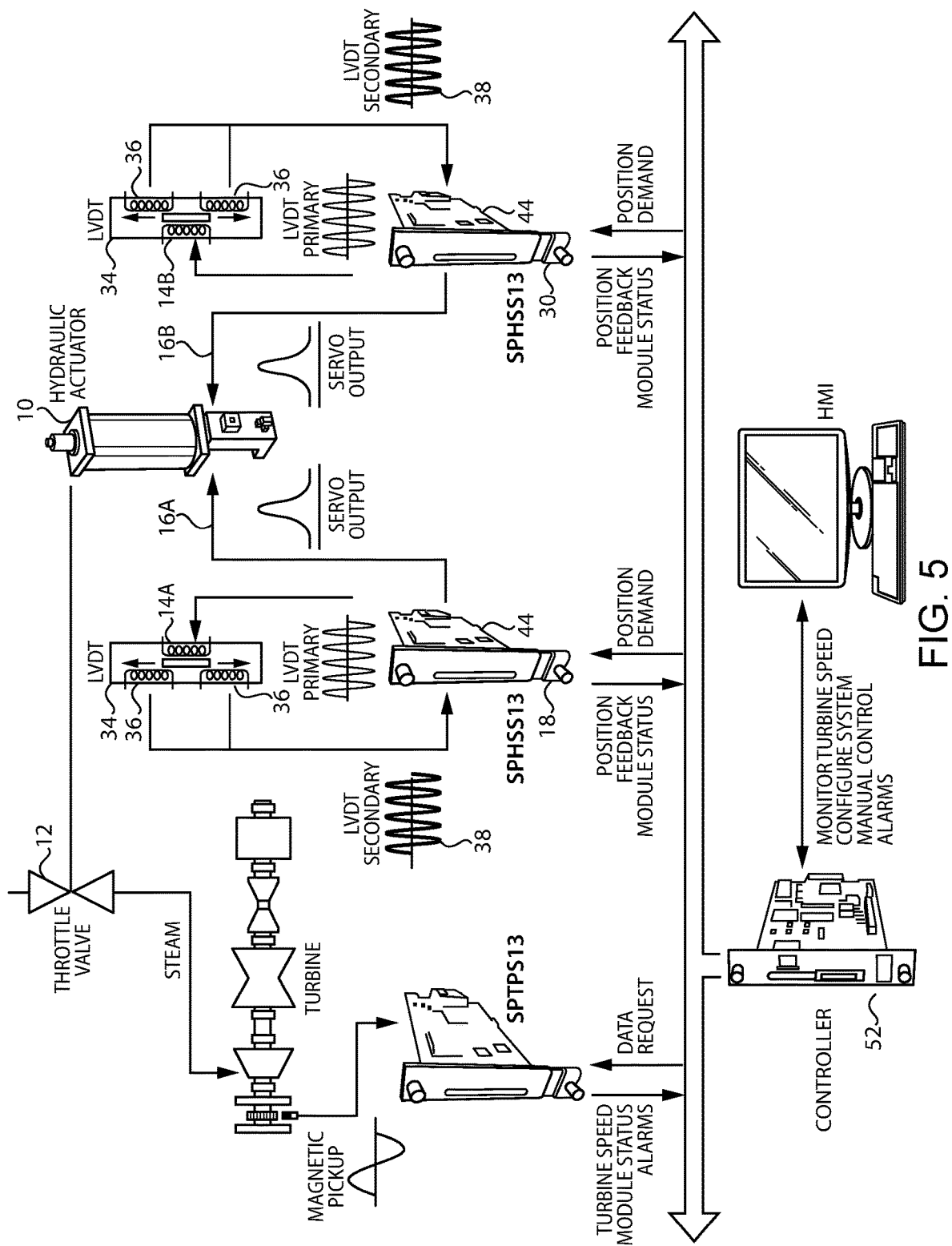
FIG. 5 is a schematic of a control system for a turbine valve.
Figure 7:
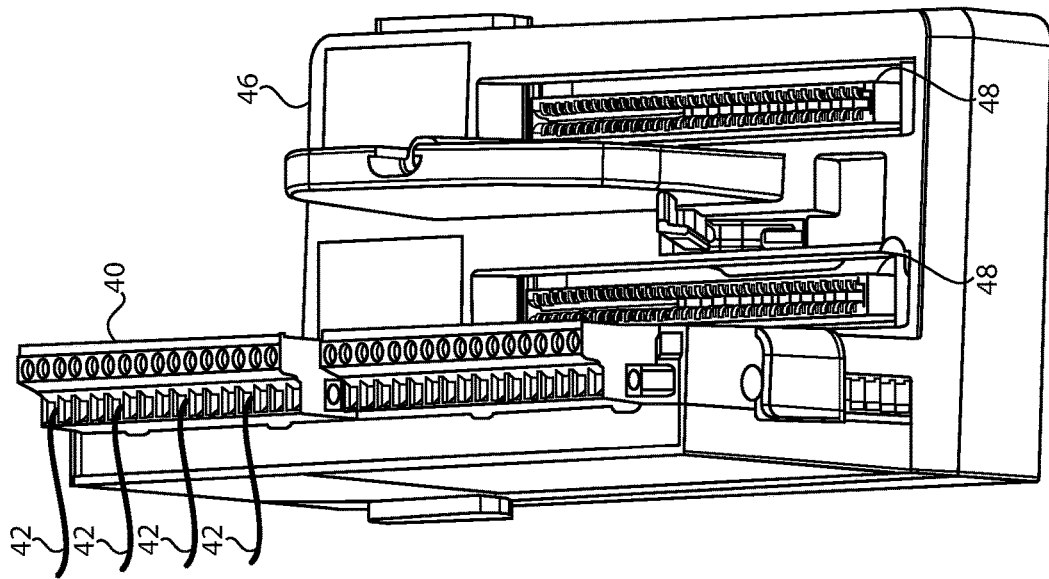
FIG. 7 is a perspective view of the base.
Figure 6:
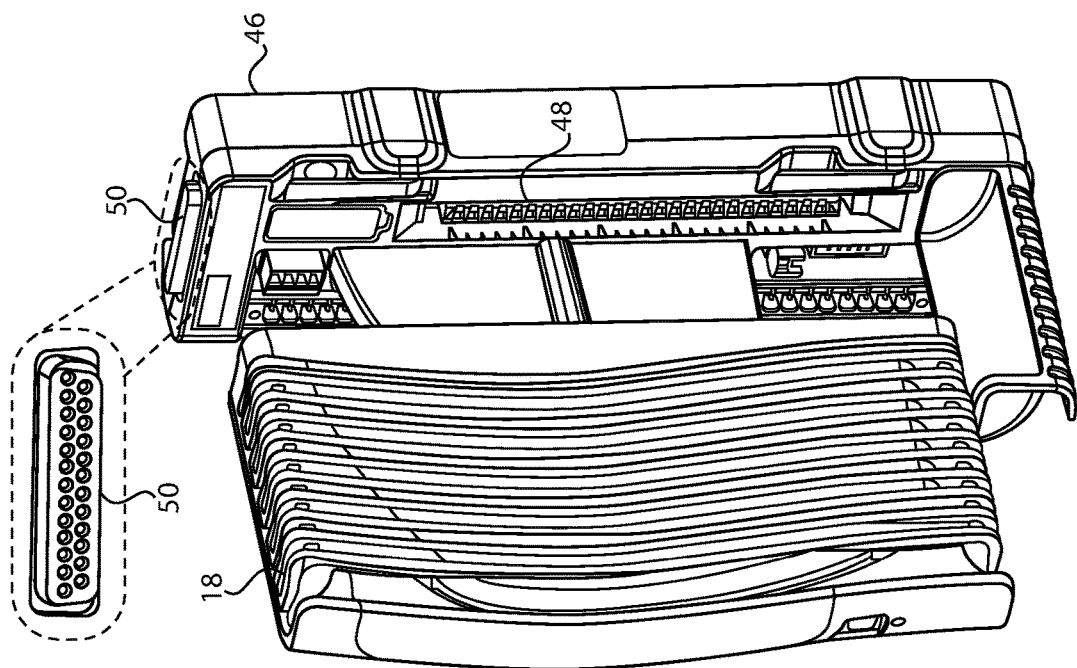
FIG. 6 is a perspective view of a valve positioner module and a base.
Figure 8:
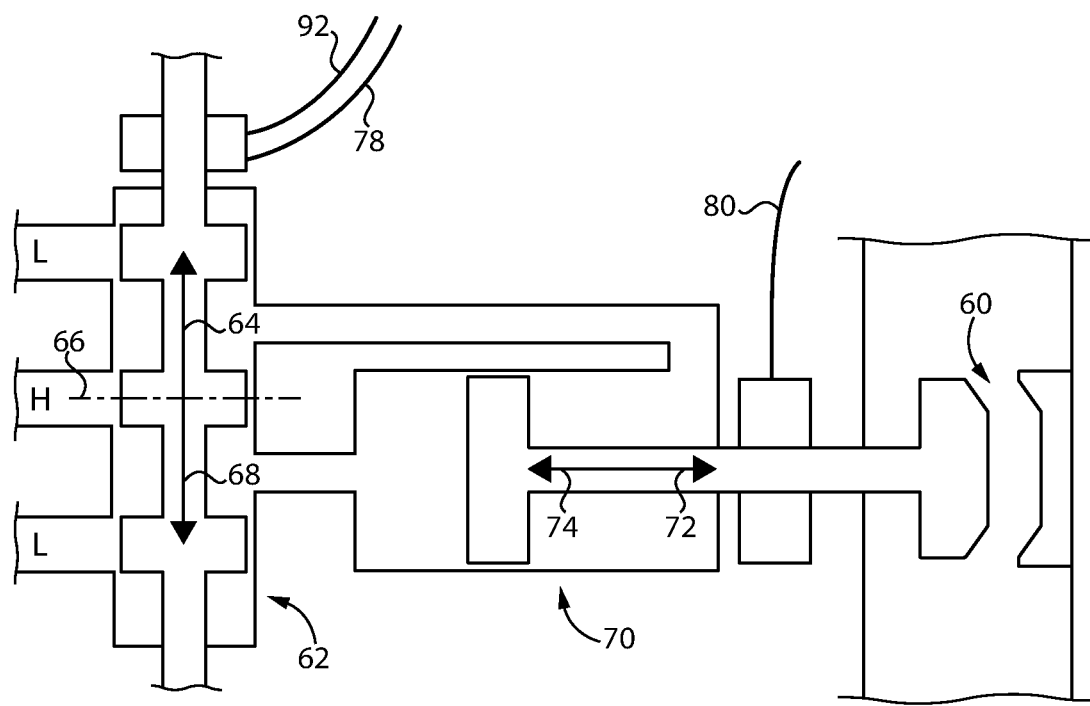
FIG. 8 is a schematic of a hydraulic pilot valve section and a main hydraulic valve section of a turbine valve.

An exemplary control algorithm is shown in FIG. 4.

A principal application for the preferred embodiments is generally large steam turbines at electrical power plants. In this application, the control system interfaces with a main steam valve controlled by a pilot valve. Furthermore, the control system may also be used on other smaller machines.

A problem overcome by the preferred embodiments is the need to control the position of a servo valve actuator that utilizes a two phase cascaded control process, each with its own position indicating transducer and each with its own transfer function. Another problem overcome by the preferred embodiments is that control must be stable and fast responding, while providing for a user friendly and intuitive method to balance out the two control loops to achieve optimal control. The preferred embodiments also address the physical constraints and configuration requirements of various implementations of this type of actuator with a single solution. The preferred embodiments also improve upon hardware solutions designed to control one specific implementation of this type of actuator. These solutions are specific to one actuator and are not readily configurable or tunable for either the setting of the PID values or the compensation for the rate difference of the transfer functions. The preferred embodiments also improve upon utilization of two individual controllers to control the operation of each phase of the cascaded process separately, using an inner loop/outer loop interaction between them. These solutions can prove difficult to implement due to the timing constraints built into the required interaction between the two phases.

One advantage of the preferred embodiments is that soft configuration of the PID settings provides the flexibility to apply this solution to various implementations of this type of actuator. Another advantage is that soft configuration of the PID settings provides the ability to tune the operation of the control functionality. Another advantage is that soft configuration of the compensation for the rate difference of the transfer functions provides the flexibility to apply this solution to various implementations of this type of actuator. Another advantage is that the solution may be provided via a single module.

The preferred embodiments provide configurable parameters built into the software control algorithm to provide on-the-fly adjustment of the control configuration so that it may be used to control any implementation of this type of actuator. The solution provided by the preferred embodiments may be contained within a single module, so that it is not necessary to use multiple modules with tight timing characteristics between them.

The position of the pilot valve may be controlled by the bias demand. The position of the pilot valve controls oil flow to the main valve (or steam valve) to control the position of the main valve. The position demand for the main valve is the desired set value for the main valve. Thus, in order to achieve the desired set value for the main valve, the bias demand must be controlled.

The inventions as described herein may have one or more of the following features in addition to any of the features described above. Referring to the figures, the following features are shown.

A system for redundant valve positioning including a mechanical valve positioner 10 connected to a turbine valve 12 to open and close the turbine valve 12, the mechanical valve positioner 10 comprising a first coil 14A, 16A and a second coil 14B, 16B to control or sense movement of the mechanical valve positioner 10; a first valve positioner 18 comprising a first drive circuit 20A, 22A and a second drive circuit 20B, 22B, the first drive circuit 20A, 22A comprising a first driver 24, 26 and a first switch 28, and the second drive circuit 20B, 22B comprising a second driver 24, 26 and a second switch 28, the first drive circuit 20A, 22A being in communication the first coil 14A, 16A and the second drive circuit 20B, 22B being in communication with the second coil 14B, 16B; a second valve positioner 30 comprising a third drive circuit 20A, 22A and a fourth drive circuit 20B, 22B, the third drive circuit 20A, 22A comprising a third driver 24, 26 and a third switch 28, and the fourth drive circuit 20B, 22B comprising a fourth driver 24, 26 and a fourth switch 28, the third drive circuit 20A, 22A being in communication the first coil 14A, 16A and the fourth drive circuit 20B, 22B being in communication with the second coil 14B, 16B; wherein only one of the first switch 28 and the third switch 28 is closed at a time, the first driver 24, 26 and the third driver 24, 26 thereby being alternately connected to the first coil 14A, 16A at different times such that the first driver 24, 26 and the third driver 24, 26 do not drive the first coil 14A, 16A at a same time; and wherein only one of the second switch 28 and the fourth switch 28 is closed at a time, the second driver 24, 26 and the fourth driver 24, 26 thereby being alternately connected to the second coil 14B, 16B at different times such that the second driver 24, 26 and the fourth driver 24, 26 do not drive the second coil 14B, 16B at a same time.

The system for redundant valve positioning wherein the first coil 14A, 16A and the second coil 14B, 16B are redundant coils.

The system for redundant valve positioning wherein the first coil 14A and the second coil 14B are redundant position sensing coils 14A, 14B.

The system for redundant valve positioning wherein the first coil 14A and the second coil 14B are each a primary coil 32 in a respective first linear variable differential transformer (LVDT) 34 and a second linear variable differential transformer (LVDT) 34, the first LVDT 34 and the second LVDT 34 being redundant LVDTs.

The system for redundant valve positioning wherein the first LVDT 34 comprises a first secondary coil 36 outputting a first position signal 38 and the second LVDT 34 comprises a second secondary coil 36 outputting a second position signal 38, the first secondary coil 36 and the second secondary coil 36 both being in communication with the first valve positioner 18 and the second valve positioner 30 such that the first valve positioner 18 and the second valve positioner 30 both receive the first position signal 38 and the second valve position signal 38.

The system for redundant valve positioning wherein the communications between the first secondary coil 36, the second secondary coil 36, the first valve positioner 18 and the second valve positioner 30 are non-switched such that the first valve positioner 18 and the second valve positioner 30 both receive the first position signal 38 and the second position signal 38 at a same time.

The system for redundant valve positioning wherein the first coil 16A and the second coil 16B are redundant servo positioning coils 16A, 16B.

The system for redundant valve positioning wherein the first valve positioner 18 and the second valve positioner 30 share a termination unit 40 which interfaces with the first coil 14A, 16A and the second coil 14B, 16B.

The system for redundant valve positioning wherein a first field wire 42 connects the first coil 14A, 16A to the termination unit 40 and a second field wire 42 connects the second coil 14B, 16B to the termination unit 40, the first drive circuit 20A, 22A and the third drive circuit 20A, 22A both communicating with the first coil 14A, 16A through the first field wire 42 and the second drive circuit 20B, 22B and the fourth drive circuit 20B, 22B both communicating with the second coil 14B, 16B through the second field wire 42.

The system for redundant valve positioning wherein the first valve positioner 18 and the second valve positioner 30 are separate hardware modules.

The system for redundant valve positioning wherein the first valve positioner 18 comprises a first circuit board 44 and the second valve positioner 30 comprises a second circuit board 44, the first drive circuit 20A, 22A and the second drive circuit 20B, 22B being incorporated into the first circuit board 44, and the third drive circuit 20A, 22A and the fourth drive circuit 20B, 22B being incorporated into the second circuit board 44.

The system for redundant valve positioning further comprising a base 46 with a first communications connector 48 and a second communications connector 48, wherein the first valve positioner 18 is connected to the first communications connector 48 and the second valve positioner 30 is connected to the second communications connector 48, the first valve positioner 18 and the second valve positioner 30 communicating directly with each other through the base 46 to control the first switch 28, the second switch 28, the third switch 28 and the fourth switch 28.

The system for redundant valve positioning wherein the base 46 further comprises a third communications connector 50, the first valve positioner 18 and the second valve positioner 30 being in communication with a controller 52 through the third communications connector 50.

The system for redundant valve positioning wherein the first valve positioner 18 is a primary module 18 and the second valve positioner 30 is a backup module 30, the first switch 28 and the second switch 28 being closed and the third switch 28 and the fourth switch 28 being open during normal operation, and upon a failure of the first valve positioner 18 at least the first switch 28 is opened and the third switch 28 is closed to transfer control or sensing from the primary module 18 to the backup module 30.

The system for redundant valve positioning wherein the first switch 28, the second switch 28, the third switch 28 and the fourth switch 28 are each a solid state relay 28.

The system for redundant valve positioning wherein the mechanical valve positioner 10 further comprises a third coil 16A and a fourth coil 16B, the first coil 14A and the second coil 14B being redundant position sensing coils, and the third coil 16A and the fourth coil 16B being redundant servo positioning coils; the first valve positioner 18 further comprising a fifth drive circuit 22A and a sixth drive circuit 22B, the fifth drive circuit 22A comprising a fifth driver 26 and a fifth switch 28, and the sixth drive circuit 22B comprising a sixth driver 26 and a sixth switch 28, the fifth drive circuit 22A being in communication the third coil 16A and the sixth drive circuit 22B being in communication with the fourth coil 16B; the second valve positioner 30 further comprising a seventh drive circuit 22A and an eighth drive circuit 22B, the seventh drive circuit 22A comprising a seventh driver 26 and a seventh switch 28, and the eighth drive circuit 22B comprising an eighth driver 26 and an eighth switch 28, the seventh drive circuit 22A being in communication the third coil 16A and the eighth drive circuit 22B being in communication with the fourth coil 16B; wherein only one of the fifth switch 28 and the seventh switch 28 is closed at a time, the fifth driver 26 and the seventh driver 26 thereby being alternately connected to the third coil 16A at different times such that the fifth driver 26 and the seventh driver 26 do not drive the third coil 16A at a same time; and wherein only one of the sixth switch 28 and the eighth switch 28 is closed at a time, the sixth driver 26 and the eighth driver 26 thereby being alternately connected to the fourth coil 16B at different times such that the sixth driver 26 and the eighth driver 26 do not drive the fourth coil 16B at a same time.

The system for redundant valve positioning wherein the first coil 14A and the second coil 14B are each a primary coil 32 in a respective first linear variable differential transformer (LVDT) 34 and a second linear variable differential transformer (LVDT) 34, the first LVDT 34 and the second LVDT 34 being redundant LVDTs, the first LVDT 34 comprises a first secondary coil 36 outputting a first position signal 38 and the second LVDT 34 comprises a second secondary coil 36 outputting a second position signal 38, the first secondary coil 36 and the second secondary coil 36 both being in communication with the first valve positioner 18 and the second valve positioner 30 such that the first valve positioner 18 and the second valve positioner 30 both receive the first position signal 38 and the second valve position signal 38, and the communications between the first secondary coil 36, the second secondary coil 36, the first valve positioner 18 and the second valve positioner 30 are non-switched such that the first valve positioner 18 and the second valve positioner 30 both receive the first position signal 38 and the second position signal 38 at a same time.

The system for redundant valve positioning wherein the first valve positioner 18 and the second valve positioner 30 share a termination unit 40 which interfaces with the first coil 14A, the second coil 14B, the third coil 16A and the fourth coil 16B, and a first field wire 42 connects the first coil 14A to the termination unit 40, a second field wire 42 connects the second coil 14B to the termination unit 40, a third field wire 42 connects the third coil 16A to the termination unit 40 and a fourth field wire 42 connects the fourth coil 16B to the termination unit 40, the first drive circuit 20A and the third drive circuit 20A both communicating with the first coil 14A through the first field wire 42, the second drive circuit 20B and the fourth drive circuit 20B both communicating with the second coil 14B through the second field wire 42, the fifth drive circuit 22A and the seventh drive circuit 22A both communicating with the third coil 16A through the third field wire 42 and the sixth drive circuit 22B and the eighth drive circuit 22B both communicating with the fourth coil 16B through the fourth field wire 42.

The system for redundant valve positioning wherein the first valve positioner 18 and the second valve positioner 30 are separate hardware modules, the first valve positioner 18 comprises a first circuit board 44 and the second valve positioner 30 comprises a second circuit board 44, the first drive circuit 20A, the second drive circuit 20B, the fifth drive circuit 22A and the sixth drive circuit 22B being incorporated into the first circuit board 44, and the third drive circuit 20A, the fourth drive circuit 20B, the seventh drive circuit 22A and the eighth drive circuit 22B being incorporated into the second circuit board 44, further comprising a base 46 with a first communications connector 48 and a second communications connector 48, wherein the first valve positioner 18 is connected to the first communications connector 48 and the second valve positioner 30 is connected to the second communications connector 48, the first valve positioner 18 and the second valve positioner 30 communicating directly with each other through the base 46 to control the first switch 28, the second switch 28, the third switch 28, the fourth switch 28, the fifth switch 28, the sixth switch 28, the seventh switch 28 and the eighth switch 28, and wherein the base 46 further comprises a third communications connector 50, the first valve positioner 18 and the second valve positioner 30 being in communication with a controller 52 through the third communications connector 50.

A system for controlling a turbine valve 60 including a hydraulic pilot valve section 62 being moveable in a first direction 64 from a middle position 66 and moveable in a second direction 68 from the middle position 66 opposite from the first direction 64; a main hydraulic valve section 70 being moveable in a first direction 72 to close the turbine valve 60 when the hydraulic pilot valve section 62 is moved in the first direction 64 and moveable in a second direction 74 to open the turbine valve 60 when the hydraulic pilot valve section 62 is moved in the second direction 68; a position demand 76 indicating a desired position of the turbine valve 60; a first feedback 78 indicating an actual position of the hydraulic pilot valve section 62; a second feedback 80 indicating an actual position of the main hydraulic valve section 70; a pilot valve error 82 determined by a difference 84 between the middle position 66 of the hydraulic pilot valve section 62 and the first feedback 78; a main valve error 86 determined by a difference 88 between the position demand 76 and the second feedback 80; a turbine valve error 88 determined by combining 90 the pilot valve error 82 and the main valve error 86; and a pilot valve adjustment 92 moving the hydraulic pilot valve section 62 in response to the turbine valve error 88; wherein the turbine valve error 88 is repeatedly determined and the pilot valve adjustment 92 repeatedly moves the hydraulic pilot valve section 62 to minimize the turbine valve error 88.

The system for controlling a turbine valve wherein the turbine valve 60 is a steam valve 60.

The system for controlling a turbine valve further comprising a weight gain 94 applied to the pilot valve error 82 or the main valve error 86.

The system for controlling a turbine valve wherein the weight gain 94 applies a greater weight to the pilot valve error 82.

The system for controlling a turbine valve wherein the turbine valve error 88 further incorporates a proportional gain 96 and an integral factor 98.

It is understood that the preferred embodiments described herein may be implemented as computerized methods in a non-transitory computer readable medium if desired.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A system for redundant valve positioning, comprising:
   a mechanical valve positioner connected to a turbine valve to open and close the turbine valve, the mechanical valve positioner comprising a first coil and a second coil to control or sense movement of the mechanical valve positioner;
   a first valve positioner comprising a first drive circuit and a second drive circuit, the first drive circuit comprising a first driver and a first switch, and the second drive circuit comprising a second driver and a second switch, the first drive circuit being in communication the first coil and the second drive circuit being in communication with the second coil;
   a second valve positioner comprising a third drive circuit and a fourth drive circuit, the third drive circuit comprising a third driver and a third switch, and the fourth drive circuit comprising a fourth driver and a fourth switch, the third drive circuit being in communication the first coil and the fourth drive circuit being in communication with the second coil;
   wherein only one of the first switch and the third switch is closed at a time, the first driver and the third driver thereby being alternately connected to the first coil at different times such that the first driver and the third driver do not drive the first coil at a same time; and
   wherein only one of the second switch and the fourth switch is closed at a time, the second driver and the fourth driver thereby being alternately connected to the second coil at different times such that the second driver and the fourth driver do not drive the second coil at a same time.

2. The system for redundant valve positioning according to claim 1, wherein the first coil and the second coil are redundant coils.

3. The system for redundant valve positioning according to claim 1, wherein the first coil and the second coil are redundant position sensing coils.

4. The system for redundant valve positioning according to claim 3, wherein the first coil and the second coil are each a primary coil in a respective first linear variable differential transformer (LVDT) and a second respective linear variable differential transformer (LVDT), the first LVDT and the second LVDT being redundant LVDTs.

5. The system for redundant valve positioning according to claim 4, wherein the first LVDT comprises a first secondary coil outputting a first position signal and the second LVDT comprises a second secondary coil outputting a second position signal, the first secondary coil and the second secondary coil both being in communication with the first valve positioner and the second valve positioner such that the first valve positioner and the second valve positioner both receive the first position signal and the second valve position signal.

6. The system for redundant valve positioning according to claim 5, wherein the communications between the first secondary coil, the second secondary coil, the first valve positioner and the second valve positioner are non-switched such that the first valve positioner and the second valve positioner both receive the first position signal and the second position signal at a same time.

7. The system for redundant valve positioning according to claim 1, wherein the first coil and the second coil are redundant servo positioning coils.

8. The system for redundant valve positioning according to claim 1, wherein the first valve positioner and the second valve positioner share a termination unit which interfaces with the first coil and the second coil.

9. The system for redundant valve positioning according to claim 8, wherein a first field wire connects the first coil to the termination unit and a second field wire connects the second coil to the termination unit, the first drive circuit and the third drive circuit both communicating with the first coil through the first field wire and the second drive circuit and the fourth drive circuit both communicating with the second coil through the second field wire.

10. The system for redundant valve positioning according to claim 1, wherein the first valve positioner and the second valve positioner are separate hardware modules.

11. The system for redundant valve positioning according to claim 10, wherein the first valve positioner comprises a first circuit board and the second valve positioner comprises a second circuit board, the first drive circuit and the second drive circuit being incorporated into the first circuit board, and the third drive circuit and the fourth drive circuit being incorporated into the second circuit board.

12. The system for redundant valve positioning according to claim 11, further comprising a base with a first communications connector and a second communications connector, wherein the first valve positioner is connected to the first communications connector and the second valve positioner is connected to the second communications connector, the first valve positioner and the second valve positioner communicating directly with each other through the base to control the first switch, the second switch, the third switch and the fourth switch.

13. The system for redundant valve positioning according to claim 12, wherein the base further comprises a third communications connector, the first valve positioner and the second valve positioner being in communication with a controller through the third communications connector.

14. The system for redundant valve positioning according to claim 1, wherein the first valve positioner is a primary module and the second valve positioner is a backup module, the first switch and the second switch being closed and the third switch and the fourth switch being open during normal operation, and upon a failure of the first valve positioner at least the first switch is opened and the third switch is closed to transfer control or sensing from the primary module to the backup module.

15. The system for redundant valve positioning according to claim 1, wherein the first switch, the second switch, the third switch and the fourth switch are each a solid state relay.

16. The system for redundant valve positioning according to claim 1, wherein:
the mechanical valve positioner further comprises a third coil and a fourth coil, the first coil and the second coil being redundant position sensing coils, and the third coil and the fourth coil being redundant servo positioning coils;
the first valve positioner further comprising a fifth drive circuit and a sixth drive circuit, the fifth drive circuit comprising a fifth driver and a fifth switch, and the sixth drive circuit comprising a sixth driver and a sixth switch, the fifth drive circuit being in communication the third coil and the sixth drive circuit being in communication with the fourth coil;
the second valve positioner further comprising a seventh drive circuit and an eighth drive circuit, the seventh drive circuit comprising a seventh driver and a seventh switch, and the eighth drive circuit comprising an eighth driver and an eighth switch, the seventh drive circuit being in communication the third coil and the eighth drive circuit being in communication with the fourth coil;
wherein only one of the fifth switch and the seventh switch is closed at a time, the fifth driver and the seventh driver thereby being alternately connected to the third coil at different times such that the fifth driver and the seventh driver do not drive the third coil at a same time; and
wherein only one of the sixth switch and the eighth switch is closed at a time, the sixth driver and the eighth driver thereby being alternately connected to the fourth coil at different times such that the sixth driver and the eighth driver do not drive the fourth coil at a same time.

17. The system for redundant valve positioning according to claim 16, wherein the first coil and the second coil are each a primary coil in a respective first linear variable differential transformer (LVDT) and a second respective linear variable differential transformer (LVDT), the first LVDT and the second LVDT being redundant LVDTs, the first LVDT comprises a first secondary coil outputting a first position signal and the second LVDT comprises a second secondary coil outputting a second position signal, the first secondary coil and the second secondary coil both being in communication with the first valve positioner and the second valve positioner such that the first valve positioner and the second valve positioner both receive the first position signal and the second valve position signal, and the communications between the first secondary coil, the second secondary coil, the first valve positioner and the second valve positioner are non-switched such that the first valve positioner and the second valve positioner both receive the first position signal and the second position signal at a same time.

18. The system for redundant valve positioning according to claim 17, wherein the first valve positioner and the second valve positioner share a termination unit which interfaces with the first coil, the second coil, the third coil and the fourth coil, and a first field wire connects the first coil to the termination unit, a second field wire connects the second coil to the termination unit, a third field wire connects the third coil to the termination unit and a fourth field wire connects the fourth coil to the termination unit, the first drive circuit and the third drive circuit both communicating with the first coil through the first field wire, the second drive circuit and the fourth drive circuit both communicating with the second coil through the second field wire, the fifth drive circuit and the seventh drive circuit both communicating with the third coil through the third field wire and the sixth drive circuit and the eighth drive circuit both communicating with the fourth coil through the fourth field wire.

19. The system for redundant valve positioning according to claim 18, wherein the first valve positioner and the second valve positioner are separate hardware modules, the first valve positioner comprises a first circuit board and the second valve positioner comprises a second circuit board, the first drive circuit, the second drive circuit, the fifth drive circuit and the sixth drive circuit being incorporated into the first circuit board, and the third drive circuit, the fourth drive circuit, the seventh drive circuit and the eighth drive circuit being incorporated into the second circuit board, further comprising a base with a first communications connector and a second communications connector, wherein the first valve positioner is connected to the first communications connector and the second valve positioner is connected to the second communications connector, the first valve positioner and the second valve positioner communicating directly with each other through the base to control the first switch, the second switch, the third switch, the fourth switch, the fifth switch, the sixth switch, the seventh switch and the eighth switch, and wherein the base further comprises a third communications connector, the first valve positioner and the second valve positioner being in communication with a controller through the third communications connector.

* * * * *